United States Patent [19]
Baran et al.

[11] Patent Number: 5,357,050
[45] Date of Patent: Oct. 18, 1994

[54] APPARATUS AND METHOD TO REDUCE ELECTROMAGNETIC EMISSIONS IN A MULTI-LAYER CIRCUIT BOARD

[75] Inventors: Jozef B. Baran, Moreno Valley; Edward D. Suski, Lake Forest, both of Calif.

[73] Assignee: AST Research, Inc., Irvine, Calif.

[21] Appl. No.: 979,590

[22] Filed: Nov. 20, 1992

[51] Int. Cl.$^5$ ............................................. H01B 11/00
[52] U.S. Cl. ........................................ 174/33; 174/34; 174/261
[58] Field of Search ............... 174/32, 33, 34, 261, 174/262, 250; 333/238, 246, 161, 128; 361/410, 412, 414

[56] References Cited

U.S. PATENT DOCUMENTS

| | | |
|---|---|---|
| 2,754,484 | 7/1956 | Adams . |
| 4,490,690 | 12/1984 | Suzuki .................................... 333/1 |
| 4,605,915 | 8/1986 | Marshall et al. ......... 174/117 FF X |
| 4,954,929 | 9/1990 | Baran ................................. 361/41 X |
| 5,227,742 | 7/1993 | Suzuki ..................................... 333/1 |

FOREIGN PATENT DOCUMENTS 239899 10/1986 German Democratic Rep. ... 174/32

*Primary Examiner*—Morris H. Nimmo
*Attorney, Agent, or Firm*—Knobbe, Martens, Olson & Bear

[57] ABSTRACT

A method for defining traces on a multi-layer circuit board suppresses electro-magnetic emissions radiated from the traces. The defined traces carry a differential signal. Layers of signal and return trace pairs are formed. Each succeeding layer of traces is spaced above and follows the traces below, with the succeeding signal trace positioned above the preceding return trace and the succeeding return trace positioned above the preceding signal trace. All of the signal traces are conductively connected and all of the return traces are conductively connected. The symmetry of the arrangement causes the electro-magnetic fields generated by the conductors (traces) to cancel at any appreciable distance. Additionally, varying combinations of layers and/or varying parameters such as dimension, spacing and dielectric material, results in a desired impedance for matching to external cabling and the like.

9 Claims, 5 Drawing Sheets

FIG. 5
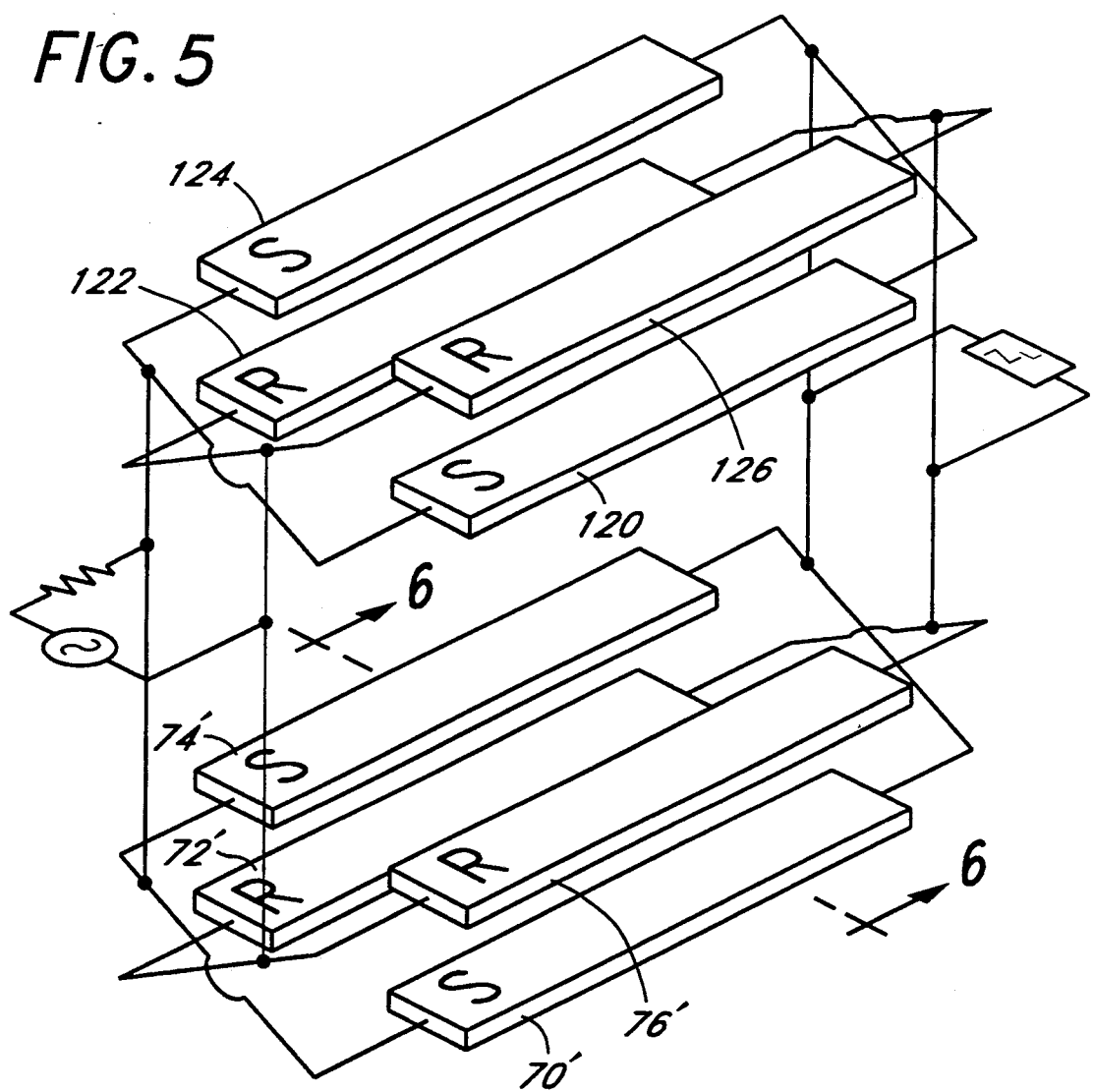
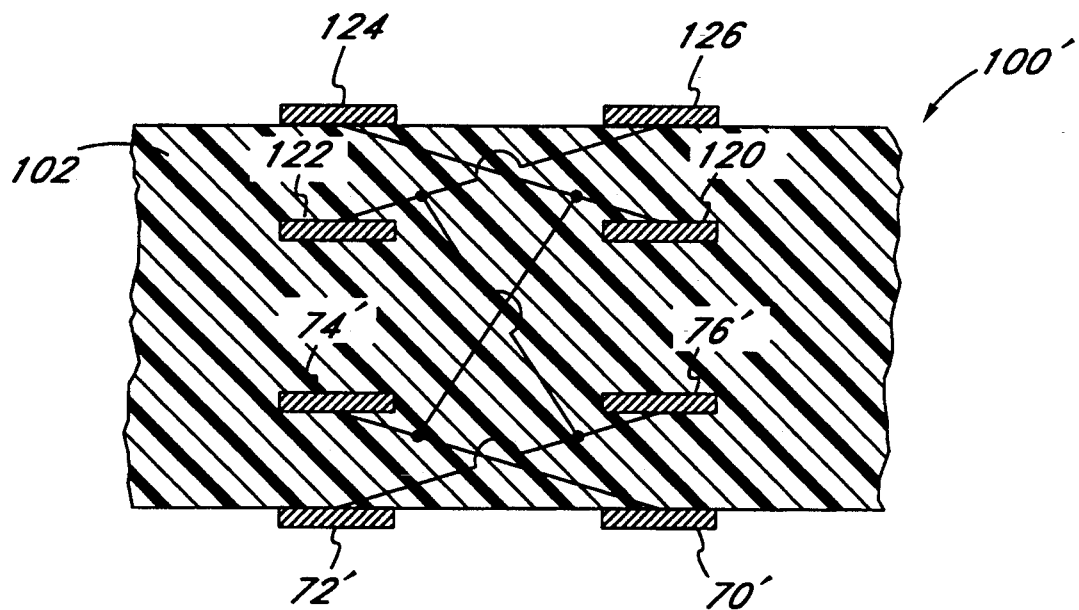
FIG. 6

APPARATUS AND METHOD TO REDUCE ELECTROMAGNETIC EMISSIONS IN A MULTI-LAYER CIRCUIT BOARD

BACKGROUND OF THE INVENTION

1. Field of the Invention

The present invention relates to digital electronic systems, and, in particular, to circuitry used in digital computers and the like. More particularly, the invention relates to the suppression of radiated electrical noise generated by the signals of such systems.

2. Description of the Related Art

The circuitry of digital electronic systems is typically mounted on printed circuit boards. For example, in small business or personal computers, such circuit boards include a main system board (often referred to as a mother board) and a number of smaller circuit boards that are inserted into connectors on the mother board. Typically, such circuit boards are multi-layer circuit boards. That is, the connection to and the interconnections between integrated circuits and other components on the surface of the circuit board are provided by metallic traces on the surface layers of the circuit board as well as on additional traces on inner layers or the bottom of the circuit board. In addition, exemplary multi-layered printed circuit boards include layers that are dedicated to a particular voltage reference. For example, the ground reference (i.e., 0 volts), may be distributed on an inner layer of the circuit board. In addition, the primary supply voltage (e.g., +5 volts) may also be distributed on a separate dedicated layer of the circuit board. Interconnections between the layers of the circuit board are provided by feed-through connections (often referred to as vias). In particular, connections between integrated circuits on the surface layers and circuit paths on the opposing surface layer are provided by vias. Similarly, the power and ground connections to the integrated circuits are provided by vias that are electrically connected to the respective voltage reference layers.

In many instances, digital electronic systems, and particularly digital computer systems, include the generation of relatively high frequency analog signals. For example, a typical microcomputer, such as an IBM PC compatible computer, generates the video signal for driving an associated video display. Furthermore, such digital electronic systems include the generation of high frequency digital signals. For example, a typical system based upon an Intel ® 80386 microprocessor operating at 25 MHz utilizes a system clock having a frequency of 50 MHz.

The high frequency signals generated by the digital systems are typically carried by the metal traces of the circuit board described above. The signals on the traces have the potential to radiate out of the system so as to interfere with the operation of television receivers and other radio frequency communications equipment. Such radio frequency interference (RFI) is not permitted, according to regulations promulgated by the Federal Communications Commission (FCC). Thus, it is necessary to suppress the radiation of electromagnetic emissions in order to comply with FCC regulations.

Additionally, the signals generated by the digital systems must in many cases be interfaced to external equipment, such as the video display, networking equipment, and the like. Therefore, the traces of the circuit board which carry the required signals must at some point interface with connectors and/or cables leading to the external devices. However, the impedance of the circuit board traces and the cables are typically drastically different. This mismatch in impedance leads to substantial undesired signal reflections which are in turn the source of further RFI.

One method of suppressing the radiation of RFI from the traces of a circuit board is to route the traces in a twisted-pair pattern. The twisted-pair carries a differential signal. The signal is represented by the difference between the voltage level of a "signal" line and the voltage level of a "return" line. The signal and the return lines of the twisted-pair traces criss-cross each other so as to form a sequence of small "current loops." Each current loop circulates current in the opposite direction. Each of the loops behaves as a miniature loop antenna, with current "circulating" just as though through a loop antenna. Since the current circulation is in opposite direction in adjacent loops, opposite electromagnetic fields are generated. The net field observed from far enough away (so that the various loops appear collectively as the same point source) tends to zero.

One failing of the twisted-pair scheme is that there must always be two "pigtail" areas, where the twisted-pair trace connects to the signal source or the load. The pigtail areas do not form opposing current loops. Rather, the pigtail portions merely comprise two separate differential conductors, side by side. The difference in voltage of the two conductors gives rise to electromagnetic emissions which are not cancelled out. Consequently, the pigtails are the source of undesired RFI.

Another failing of the twisted-pair scheme is that the fields effectively cancel out only at a distance where the length of the twisted-pair trace appears as a point. At close distances, the differing fields from each separate current loop of the length of twisted-pair can be detected. Consequently, undesired RFI will be seen at short distances, e.g., by sensitive components on the same board as the twisted-pair traces.

A further disadvantage of twisted-pair traces on circuit boards is the typical severe mismatch of impedance between the traces of the circuit board and the external cables to which they connect. The impedance mismatch leads to signal reflections which are the source of undesired RFI.

A printed circuit in accordance with the present invention overcomes these and other disadvantages and provides improved suppression of electromagnetic emissions.

SUMMARY OF THE INVENTION

In accordance with the present invention, a method is defined for effectively and efficiently suppressing the electromagnetic emissions of differential signals on printed circuit boards. The method includes arranging pairs of associated lengths of lines which carry a signal, such that the electromagnetic fields generated by the various lines effectively cancel each other. The method is typically intended for multilayer printed circuit boards, although one of ordinary skill will recognize that other environments are envisioned.

The method in accordance with the present invention includes forming opposing sets of traces. Specifically, the method includes forming a first signal line and a first return line on a first plane of the multiple layer circuit. Furthermore, the method includes forming a second signal line on a second plane of the multiple layer circuit where the second signal line is spaced above and follows the path of the first return line. Furthermore, a second return line is formed on the second plane of the multiple layer circuit wherein the second return line is spaced above and follows the path of the first signal line. The first signal line and second signal line are conductively connected. Additionally, the first return line and second return line are conductively connected.

This arrangement causes the electromagnetic fields generated by the lines to cancel out throughout the entire length of the traces. Moreover, the signals are cancelled even as observed very close to the traces.

Furthermore, the method of the present invention allows for matching the impedance of the traces of the printed circuit board to that of external cables or connectors. This is accomplished by optionally providing multiple sets of opposing sets of traces which may also vary in width and thickness. The choice of numbers of sets and dimensions will define the impedance. Consequently, the method in accordance with the present invention may further include forming a third signal line and a third return line on a third plane of the multiple layer circuit. Also, a fourth signal line is formed on a fourth plane of the multiple layer circuit such that the fourth signal line is spaced above and follows the path of the third return line. Furthermore, a fourth return line is formed on the fourth plane of the multiple layer circuit such that the fourth return line is spaced above and follows the path of the third signal line. The fourth signal line is conductively connected with the third, second, and first signal lines. Furthermore, the fourth return line is conductively connected with the third, second, and first return lines.

Additionally, certain ones of the traces may be cut out or "formed in" one of the layers of the board that is dedicated to a particular voltage layer, e.g., the ground plane or the +5-volt plane. Additionally, certain ones of the traces may be formed in a dielectric material, i.e., within an inner layer of the multilayer board. This further allows for flexibility in impedance matching because, as is well known in the art, the dielectric which surrounds the conductor effects impedance.

Thus, the method in accordance with the present invention provides the advantage of suppressing electromagnetic emissions. Specifically, the radiation of the conductor formed in accordance with the method of the present invention is cancelled along the entire length of the conductor. There is no disadvantageous pigtail area. Furthermore, the electromagnetic emissions are cancelled even when observed very close to the traces. Also, the method in accordance with the present invention provides for impedance matching to external cabling so as to minimize radiation resulting from reflections.

These and other advantages will be readily recognized in view of the following description and accompanying drawings.

BRIEF DESCRIPTION OF THE DRAWINGS

Referring now to the drawings wherein similar reference numerals and characters are applied to similar elements:

FIG. 5 is a perspective view of an additional embodiment of the traces in accordance with the present invention.

FIG. 6 is a cross-sectional view of the traces of FIG. 5.

DETAILED DESCRIPTION OF THE INVENTION

Figure 1:
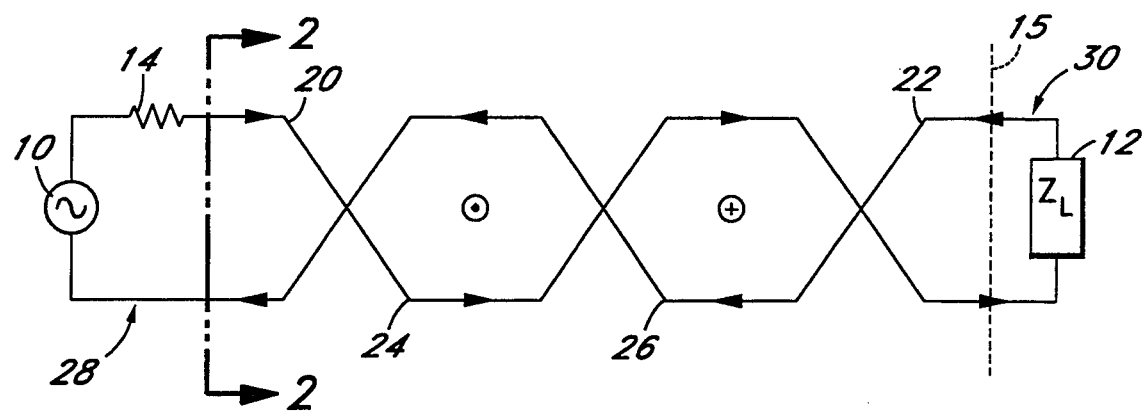
FIG. 1 is a schematic of the twisted-pair traces of the prior art.

The twisted-pair trace routing of the prior art is illustrated in FIG. 1. A signal generator 10 generates the signal to be conducted, differentially, to a load $Z_L$ 12. A resistor 14 represents the resistance of the generator 10. In a common application, the signal generator 10 would be a component in the computer which generates a video signal. Correspondingly, the load would be a video display. Cabling from the load 12 connects with the twisted-pair traces at an interface 15, marked by a dashed line in the figure.

A signal line 20 carries current to the load 12. A return line 22 returns current to the signal generator 10. As shown, the signal line 20 and the return line 22 crisscross so as to form consecutive current loops, e.g., the loops 24 and 26. The signal line 20 and the return line 22 are electrically isolated from one another with methods well-known in the art, for example, by being on separate board layers. Portions 28 and 30 are pigtail portions where the source and load, respectively, are connected to the length of twisted-pair traces. The pigtail areas do not form current loops.

Figure 2:
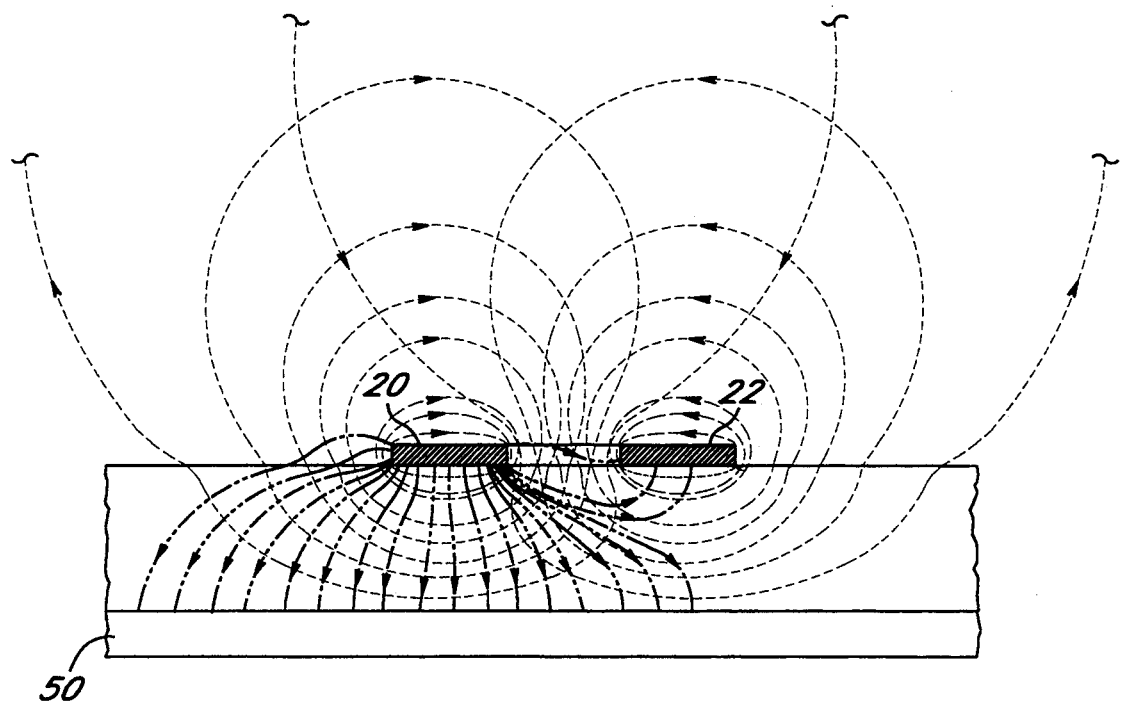
FIG. 2 is a cross-sectional view of the pigtail area of FIG. 1, indicating electric and magnetic fields.

FIG. 2 is a cross-sectional view of the pigtail area 28, with associated electric and magnetic field lines shown. A plane 50 is a ground plane (i.e., zero volts) as is commonly found in multi-layer printed circuit boards of the prior art. The phantom lines represent the electric fields produced by the conductors, while the dashed lines represent the magnetic fields. The arrows of the lines represent the direction of the fields.

A substantial electric field can be seen formed between the signal line 20 and the ground plane 50. An electric field is also formed between the signal line 20 and the return line 22, as shown. Moreover, a substantial magnetic field is seen radiating outward from the signal line 20 and the return line 22.

Both the electric and magnetic fields created by the pigtail area of the twisted-pair traces are quite substantial. The fields are not at all contained or cancelled out by opposing fields, and therefore, the fields radiate detectably at great distances.

Returning to FIG. 1, the current loops 24 and 26 are shown. The arrows indicate the direction of current flow. The current of adjacent loops circulate in opposite directions.

The circle with the dot, in the center of the loop 24, indicates that the magnetic field created by the circulating current emerges from the plane of the drawing, when viewed at the center of the loop. Similarly, the circle with the cross, in the center of the loop 26, indicates that the magnetic field created by the circulating current enters the plane of the drawing, when viewed at the center of the loop. As is well-known, the magnetic fields have associated orthogonal electric fields.

When sensed from a distance far enough such that the length of the twisted-pair traces appears as a point source, the fields generated by the current loop portions appear to cancel each other. However, when sensed close to the traces, the differing fields in consecutive loops can be detected as emissions, i.e., RFI. This RFI can effect components on the same or nearby boards, etc. Furthermore, this RFI can radiate to other nearby traces, creating "cross talk."

Figure 3:
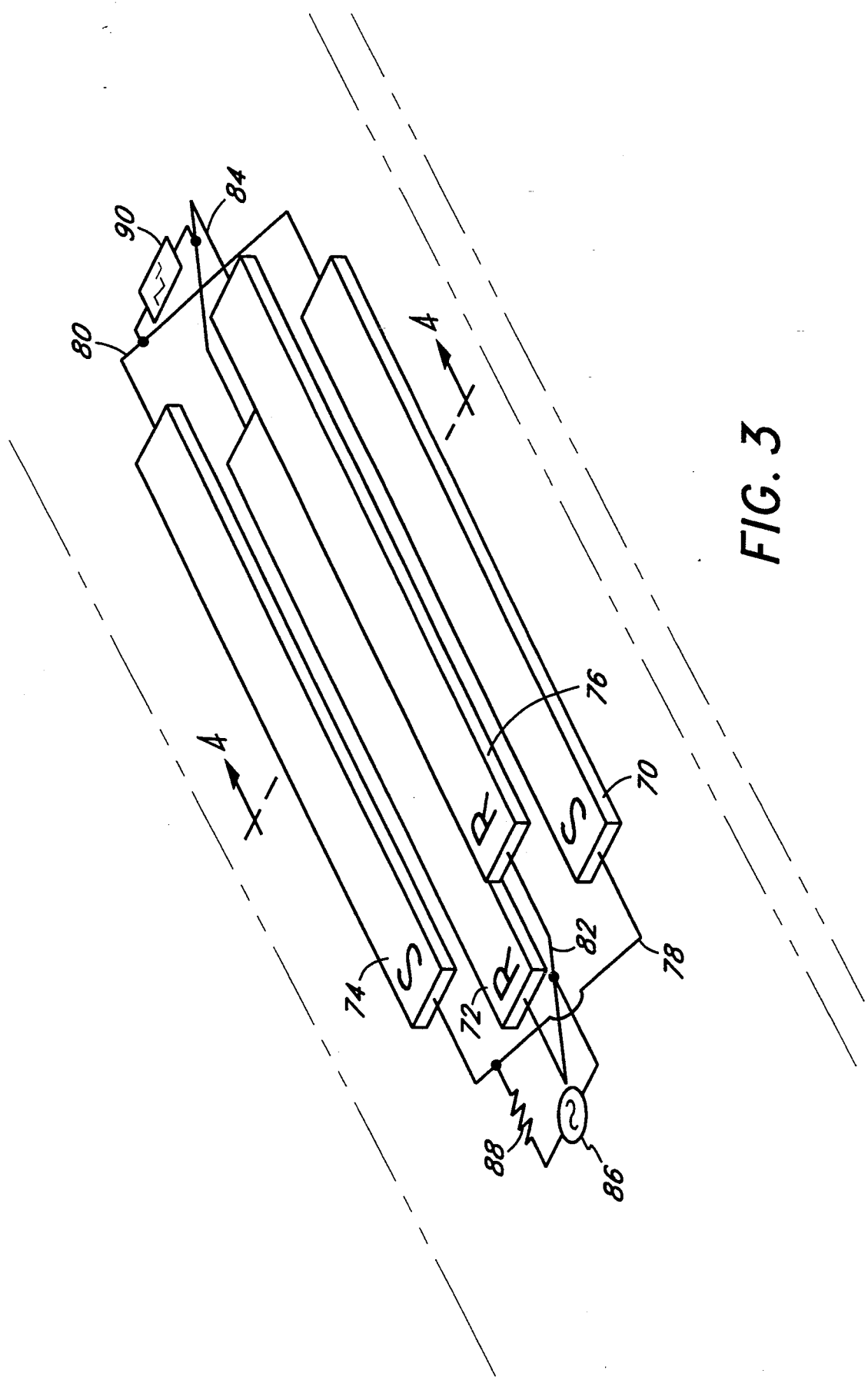
FIG. 3 is a perspective view of the traces in accordance with the present invention.

Differential signal carrying traces in accordance with the present invention eliminate these and other disadvantages, and effectively suppress the undesired RFI. FIG. 3 illustrates the traces in accordance with the present invention.

Figure 4:
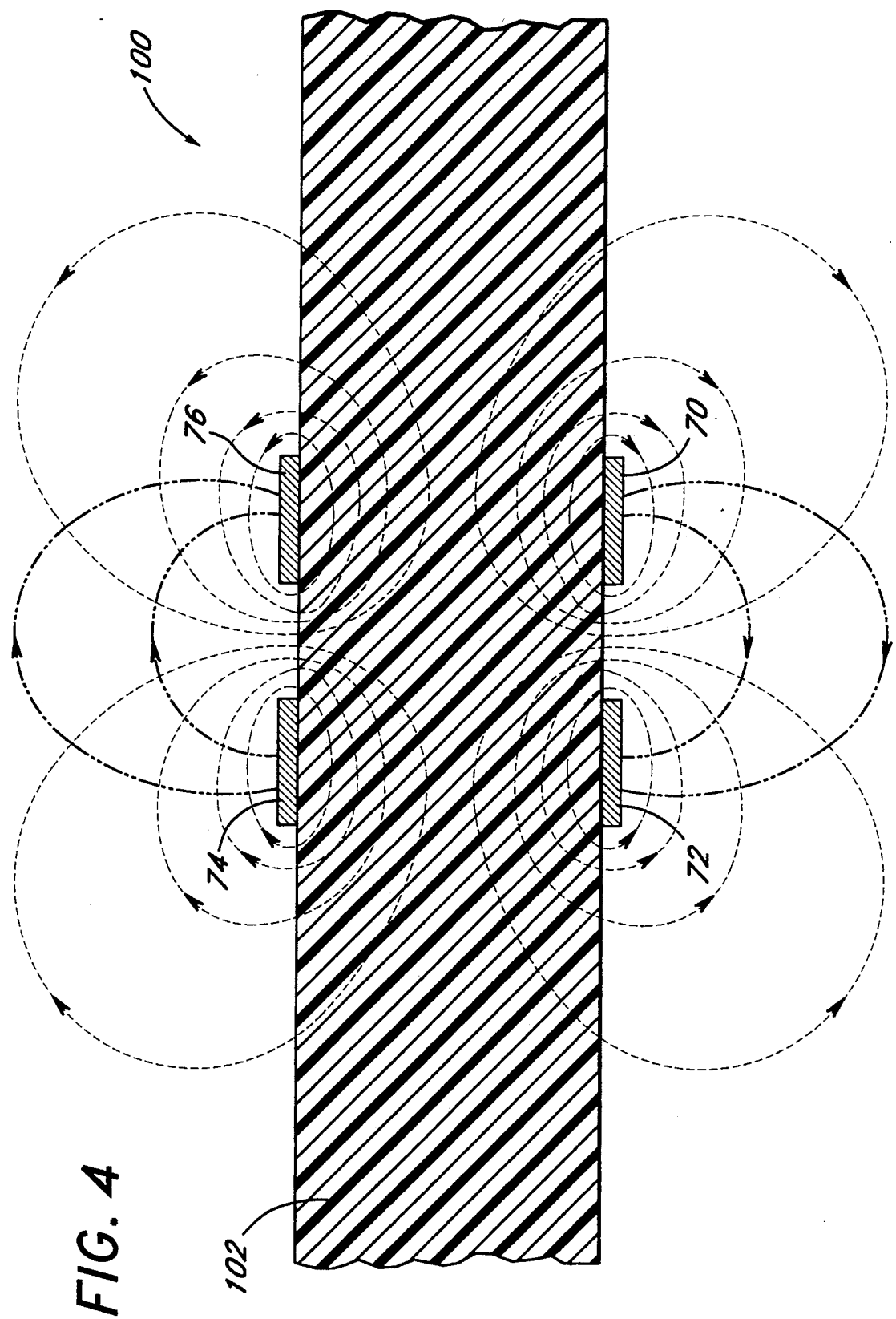
FIG. 4 is a cross-sectional view of the traces of FIG. 3, indicating electric and magnetic fields.
Figure 7:
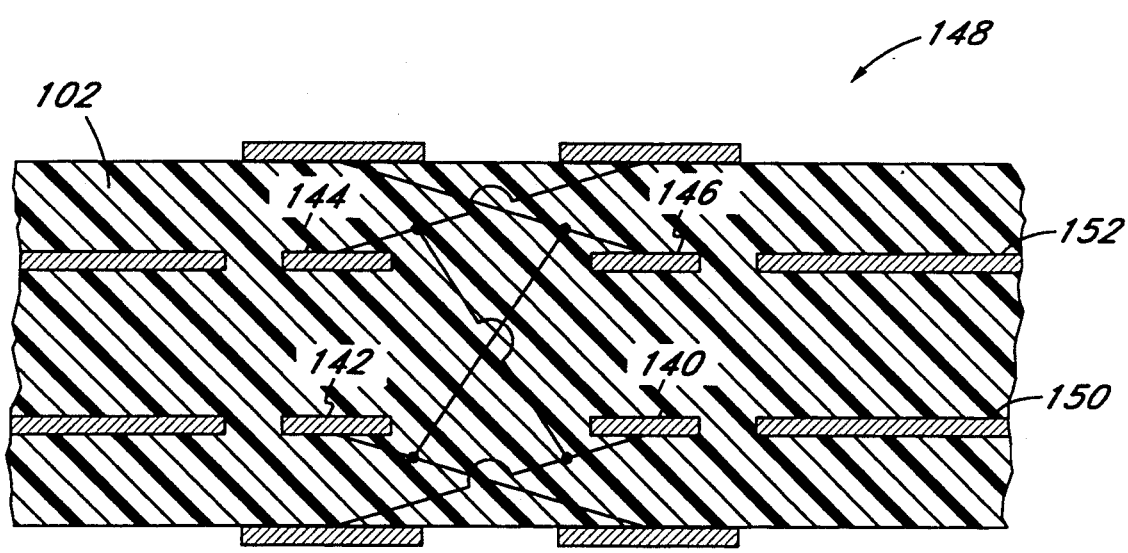
FIG. 7 is a cross-sectional view of an additional embodiment of traces in accordance with the present invention, wherein the centered layers are formed in respective referenced voltage planes.

According to the preferred method of the present invention, a first signal (S) line 70 and a first return (R) line 72 are formed on a first plane of a multi-layer circuit board. In the preferred embodiment, the first signal and return lines are metal traces formed on the bottom of a multi-layer circuit board. The board itself is shown only in phantom in FIG. 3 so that the traces can be clearly shown. The multi-layer circuit board comprises a dielectric material 102 (FIGS. 4, 6 and 7). The traces may be formed on the board in a variety of well-known manners, for example, employing photolithographic and etching techniques.

Additionally, a second signal (S) line 74 is formed on a second plane of the multi-layer circuit board such that the second signal line is spaced above and follows the path of the first return line. Also, a second return (R) line 76 is formed on the second plane of the multi-layer circuit such that the second return line is spaced above and follows the path of the first signal line. It will be recognized that the second signal and return lines may also be formed employing well-known printed circuit board fabrication techniques.

Additionally, the first and second signal lines are conductively connected as indicated by connections 78 and 80. It will be recognized that the connections may be made with well-known printed circuit board fabrication techniques such as plated throughholes or vias.

Also, the first and second return lines are conductively connected as indicated by connections 82 and 84. These connections may also be made in a well-known manner, for example using plated throughholes or vias.

A signal generator 86, which is analogous to the signal generator 10 of FIG. 1, is coupled at a "signal" end to a resistor 88, analogous to the resistor 14 of FIG. 1. The resistor 88 represents the resistance of the generator 86. The resistor 88 is coupled at its other end to the signal lines, 70 and 74, the coupling facilitated by a connection 78. The signal generator 84 is coupled at a "return" end to the return lines, 72 and 76, the coupling facilitated by a connection 82.

A load $Z_L$ 90 shown in FIG. 3 is analogous to the load $Z_L$ 12 in FIG. 1. A "high" end of the load $Z_L$ 90 is coupled to the signal lines, 70 and 74, the coupling being facilitated by a connection 80. A "low" end of the load $Z_L$ 90 is coupled to the return lines, 72 and 76, the coupling facilitated by a connection 84.

Thus, the signal generated by the signal generator 86 is carried along both signal lines, 70 and 74, to the high end of load $Z_L$ 90. Furthermore, the return current is carried from the low end of the load $Z_L$ 90 along both return lines, 72 and 76, to the return end of the signal generator 86.

FIG. 4 is a cross-sectional view of the traces of FIG. 3, showing associated electric and magnetic field lines. A multi-layer circuit board 100 is shown.

The first signal line 70 and first return line 72 are disposed on the bottom layer of the board 100. Furthermore, the second signal line 74 and the second return line 76 are disposed along the top layer of the board 100. The phantom lines represent the electric fields produced by the conductors, while the dashed lines represent the magnetic fields. The arrows of the lines represent the direction of the fields. Although, as would be expected according to well-known electromagnetic theory, each conductor has an associated magnetic field and electric field, the arrangement of the conductors are such that these fields are well-contained and do not radiate very far. As illustrated, the arrangement creates an equal amount of electric and magnetic field in opposite directions relative to one another. For example, the left to right electric field flowing from the signal line 74 to the return line 76 is offset by the right to left electric field flowing from the signal line 70 to the return line 72. Similarly, there are two clockwise magnetic fields, one surrounding the signal line 74 and one surrounding the signal line 70. These are offset by the two counterclockwise magnetic fields; the one surrounding the return line 76 and the one surrounding the return line 72. Thus, the symmetry of the opposing sets of conductors creates cancellation at any appreciable distance with respect to each conductor. Since the symmetry of the traces of the present invention exists throughout the entire length of the traces, the emissions are cancelled throughout the entire length of the traces. Thus, there are no asymmetric pigtail areas to generate undesired emissions.

The embodiments of FIGS. 3 and 4 provide a differential signal line having an impedance determined by the sizes and spacing of the conductors. FIGS. 5 and 6 illustrate how the preferred method of the present invention may provide impedance matching between the defined traces and external cabling or connectors, so as to avoid reflections which produce undesired RFI. Generally, the embodiment shown in FIGS. 5 and 6 is a combination of four layers of opposing conductors, similar to the two layers of the embodiment shown in FIG. 3.

The embodiment of FIG. 5 adds a third signal (S) line 120 and a third return (R) line 122 on a third plane of the multiple layer circuit. Additionally, a fourth signal (S) line 124 is formed on a fourth plane of the multiple layer circuit such that the fourth signal line 124 is spaced above and follows the path of the third return line 122. Additionally, a fourth return line 126 is formed on the fourth plane of the multiple layer circuit such that the fourth return (R) line 126 is spaced above and follows the path of the third signal line 120. The lines 70', 72', 74' and 76' are analogous to the corresponding lines shown in FIG. 4o Note, however, as will be detailed below, lines 74' and 76' lie within the circuit board rather than on the surface of the board. The fourth signal line 124 is conductively connected with the third, second and first signal lines 120, 74' and 70'. Also, the fourth return line 126 is conductively connected to the third, second and first return lines, 122, 76' and 72'. As discussed previously, the fabrication techniques for forming these lines and connections are well-known.

FIG. 6 illustrates a distinction between the embodiment of FIG. 5 and that of FIG. 3. FIG. 6 is a cross-section of the traces of FIG. 5. It can be seen that the two center layers are formed within the dielectric medium 102 of the multilayer board 100'. It will be readily recognized by one of ordinary skill in the art that the dielectric medium 102 containing a conductor affects the impedance of the conductor. It will further be recognized that the entire set of traces may be designed to provide the desired impedance in a straight-forward manner, for example, using computer-aided design software such as TOUCHSTONE ™ by EEsof ™ or MDS ™ by Hewlett-Packard ™ or XFX ™ by Quad Design ™. The designer may vary parameters such as dimensions, spacing and dielectric material of the board, as is well-known, to arrive at the desired impedance. Nevertheless, it must be remembered that symmetry must be maintained (i.e., if one of the two inner layers is varied in spacing or dimension, etc., the other inner layer must vary symmetrically). However, the two center layers may be different from the two outer layers and the required symmetry will still be maintained.

The embodiment of FIG. 5 comprises four layers of conductors which typically halve the impedance, compared to a two-layer embodiment, such as that of FIG. 3, as is well-known. Although a low-impedance application is described, it will be readily recognized that the dimensions, spacing and dielectric may be varied in the two-layer embodiment so as to increase impedance. It will also be recognized that the method may be extended to any number of layers of a multilayer circuit (e.g., 6, 8, 10 . . .), so long as symmetry is maintained.

Yet another variation in accordance with a preferred method is illustrated in the cross-sectional view shown in FIG. 7. Again, a four-layer set of conductors is shown. In FIG. 7, conductors 140, 142, 144 and 146 within the dielectric 102 of the board 148, are of different dimension than those on the top and bottom of the board. However, as discussed above, overall symmetry is maintained. The notable feature of the embodiment shown in FIG. 7, is that the traces of the inner layers are formed in planes that are dedicated to a particular reference voltage, e.g., 0 volts and +5. Specifically, the signal line 142 and the return line 140 are formed in a reference plane 150. Similarly, the signal line 146 and the return line 144 are formed in a reference plane 152. The lines formed in the reference planes are electrically isolated from the rest of the respective reference planes with methods well-known in the field of printed circuit board fabrication, for example, by etching the conductive material of the reference planes so as to define the traces.

It will be readily recognized by one having ordinary skill in the art that fabrication of the above-described embodiments may be accomplished with straight-forward application of well-known printed circuit board fabrication techniques. Additionally, well-known methods and computer software design aids may be employed to select parameters such as dimension, spacing and material so as to achieve sets of traces having a particular desired impedance. Moreover, it will be recognized that, although certain specific embodiments in accordance with the preferred method of the present invention have been described, other embodiments and environments fall naturally within the scope of the present invention.

What is claimed is:

1. An apparatus for connecting a signal source to a load on a multiple layer circuit board so as to reduce electromagnetic emissions when a signal is provided to the load from the signal source, comprising:

a first signal line and a first return line on a first plane of the multiple layer circuit board, the first signal line and the first return line each having a source end and a load end;

a second signal line on a second plane of the multiple layer circuit board wherein the second signal line is spaced above and follows the path of the first return line, the second signal line having a source end and a load end;

a second return line on the second plane of the multiple layer circuit board wherein the second return line is spaced above and follows the path of the first signal line, the second return line having a source end and a load end; and respective conductive connections between the source ends of the first and second signal lines, between the load ends of first and second signal lines, between the source ends of the first and second return lines, and between the load ends of the first and second return lines, such that the first and second signal lines carry a common signal from a signal source to a load in parallel, and the first and second return lines provide a common return path from the load to the signal source in parallel.

2. The apparatus of claim 1, further comprising:

a third signal line on a third plane of the multiple layer circuit board such that the third signal line is Spaced above and follows the path of the second return line, the third signal line having a source end and a load end;

a third return line on the third plane of the multiple layer circuit board such that the third return line is spaced above and follows the path of the second signal line, the third return line having a source end and a load end;

a fourth signal line on a fourth plane of the multiple layer circuit board such that the fourth signal line is spaced above and follows the path of the third return line, the fourth signal line having a source end and a load end;

a fourth return line on the fourth plane of the multiple layer circuit board such that the fourth return line is spaced above and follows the path of the third signal line, the fourth return line having a source end and a load end; and conductive connections between the source ends of the first, second, third and fourth signal lines., between the load ends of the first, second, third and fourth signal lines, between the source ends of the first, second, third and fourth return lines, and between the load ends of the first, second, third and fourth return lines.

3. The apparatus of claim 2, wherein the third signal line and the third return line are in a ground plane.

4. An apparatus for connecting a signal source to a load in an electrical circuit so as to suppress electromagnetic emissions when a signal is provided to the load from the signal source, comprising:

a first length of signal line;

a first length of return line adjacent to the first length of signal line, wherein the first length of return line runs along the first length of signal line;

a second length of signal line spaced above the first length of return line wherein the second length of signal line follows the path of the first length of return line;

a second length of return line spaced above the first length of signal line wherein the second length of return line follows the path of the first length of signal line; and conductive connections of the first and second lengths of signal line and conductive connections of the first and second lengths of return line such that the first and second lengths of signal line carry a common signal from a signal source to a load in parallel, and the first and second lengths of return line carry a common return signal from the load to the signal source in parallel.

5. The apparatus of claim 4, further comprising:

a third length of signal line spaced above the second length of return line such that the third length of signal line follows the second length of return line;

a third length of return line adjacent to the third length of signal line such that the third length of return line runs along the third length of signal line and is spaced above the second length of signal line;

a fourth length of signal line spaced above the third length of return line such that the fourth length of signal line follows the third length of return line;

a fourth length of return line spaced above the third length of signal line such that the fourth length of return line follows the third length of signal line; and conductive connections of the first, second, third and fourth lengths of signal line and conductive connections of the first, second, third and fourth lengths of return line.

6. The apparatus of claim 5, wherein the third length of signal line and the third length of return line are in a dielectric material.

7. The apparatus of claim 6, wherein the second length of signal line and the second length of return line are in the dielectric material, and wherein the first, second, third and fourth lengths of signal line each have a width dimension and the first, second, third and fourth lengths of return line each have a width dimension, the width dimension of the second and third lengths of signal line and the second and third lengths of return line being equal, and the width dimension of the first and fourth lengths of signal line and the first and fourth lengths of return line being equal and different from the width dimension of the second and third lengths of signal line and the second and third lengths of return line.

8. A method of suppressing electromagnetic emissions in a multiple layer circuit board when a signal is provided from a signal source to a load, the signal having a signal voltage and a return voltage, and the load having a first terminal and a second terminal, the method comprising the steps of:

providing a first signal line and a first return line on a first plane of a multiple layer circuit board;

providing a second signal line on a second plane of the multiple layer circuit board wherein the second signal line is spaced substantially above and follows the path of the first return line;

providing a second return line on the second plane of the multiple layer circuit board wherein the second return line is spaced substantially above and follows the path of the first signal line;

providing conductive connections of the first and second signal lines to the first terminal of a load;

providing conductive connections of the first and second return lines to the second terminal of the load; and applying a signal to the load by applying a signal voltage to the first and second signal lines and applying a return voltage to the first and second return lines.

9. The method of claim 8, further comprising the steps of:

providing a third signal line on a third plane of the multiple layer circuit board such that the third signal line is spaced substantially above and follows the path of the second return line;

providing a third return line on the third plane of the multiple layer circuit board such that the third return line is spaced substantially above and follows the path of the second signal line;

providing a fourth signal line on a fourth plane of the multiple layer circuit board such that the fourth signal line is spaced substantially above and follows the path of the third return line;

providing a fourth return line on the fourth plane of the multiple layer circuit board such that the fourth return line is spaced substantially above and follows the path of the third signal line;

providing conductive connections of the third and fourth signal lines to the first terminal of the load;

providing conductive connections of the third and fourth return lines to the second terminal of the load; and applying the signal to the load by applying the signal voltage to the first, second, third and fourth signal lines and applying the return voltage to the first, second, third and fourth return lines.

* * * * *